(12) United States Patent
Quiquempoix et al.

(10) Patent No.: US 9,496,887 B1
(45) Date of Patent: Nov. 15, 2016

(54) ANALOG TO DIGITAL CONVERTER WITH INTERNAL TIMER

(71) Applicant: Microchip Technology Incorporated, Chandler, AZ (US)

(72) Inventors: Vincent Quiquempoix, Divonne les bains (FR); Alexandre Barreto, Morges (CH)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 14/710,105

(22) Filed: May 12, 2015

(51) Int. Cl.
*H03M 1/00* (2006.01)
*H03M 1/34* (2006.01)
*H03M 1/12* (2006.01)

(52) U.S. Cl.
CPC .............. *H03M 1/34* (2013.01); *H03M 1/001* (2013.01); *H03M 1/002* (2013.01); *H03M 1/1245* (2013.01)

(58) Field of Classification Search
CPC .... H03M 1/34; H03M 1/002; H03M 1/1245; H03M 1/001
USPC .......................................... 341/110, 143, 155
See application file for complete search history.

(56) References Cited

U.S. PATENT DOCUMENTS

| | | | | |
|---|---|---|---|---|
| 5,487,181 A * | 1/1996 | Dailey | ..................... | H04B 1/40 455/557 |
| 6,456,219 B1 * | 9/2002 | Schreiber | .............. | H03M 3/458 341/143 |
| 6,850,044 B2 * | 2/2005 | Hansen | ................. | H02M 3/156 323/266 |
| 7,250,825 B2 * | 7/2007 | Wilson | ...................... | H03L 7/08 331/175 |
| 7,365,667 B1 | 4/2008 | Nanda et al. | .................. | 341/143 |

OTHER PUBLICATIONS

International Search Report and Written Opinion, Application No. PCT/US2016/031182, 12 pages, Aug. 10, 2016

* cited by examiner

*Primary Examiner* — Jean B Jeanglaude
(74) *Attorney, Agent, or Firm* — Slayden Grubert Beard PLLC

(57) ABSTRACT

An analog-to-digital converter includes circuitry for receiving an analog input and converting the input to a digital signal; and non-transitory control circuitry configured for: receiving a sampling time; receiving a conversion time; determining a power up time from at least one sleep mode; and causing the digital-to-analog converter to enter into the at least one sleep mode if the sum of the power up time and conversion time is less than the sampling time.

21 Claims, 5 Drawing Sheets

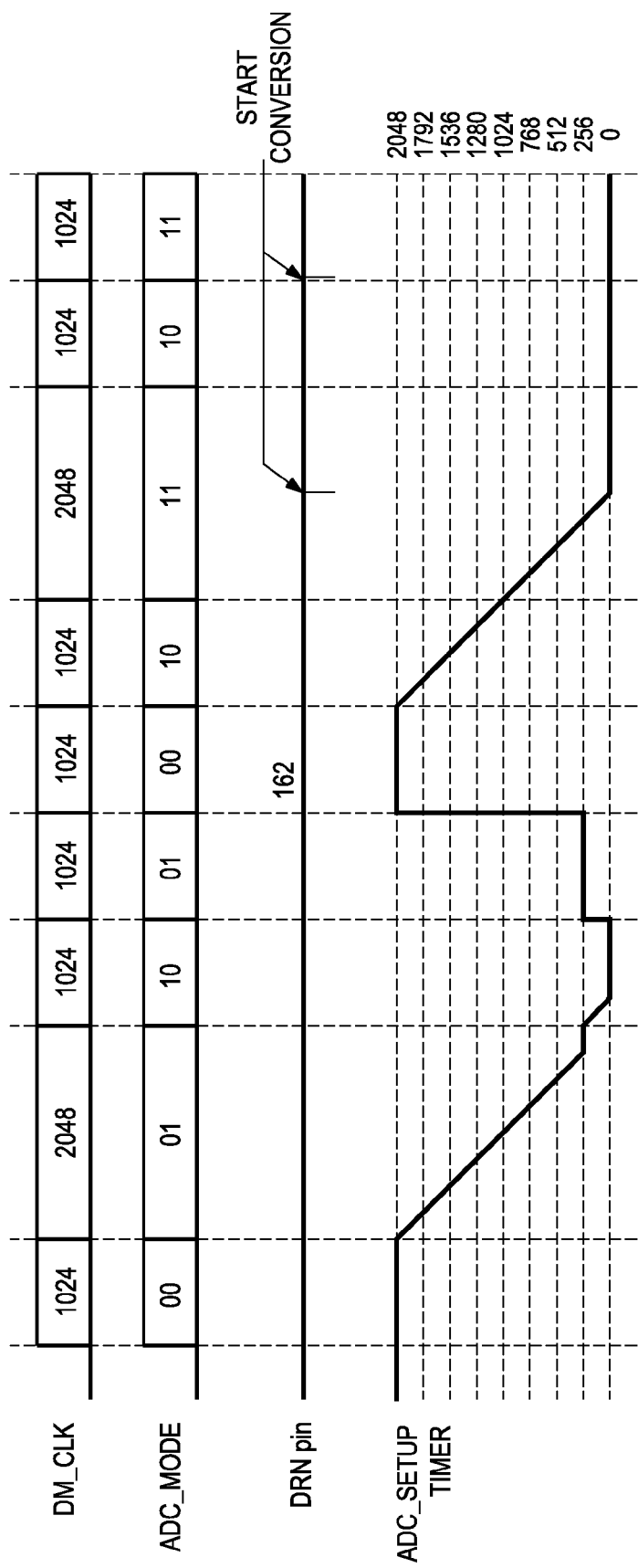

ANALOG TO DIGITAL CONVERTER WITH INTERNAL TIMER

TECHNICAL FIELD

The present disclosure relates to analog to digital converters and, particularly, to an improved analog to digital converter having an internal timer.

BACKGROUND

A low bandwidth signal may be sampled using a "fast" analog to digital converter (ADC). In such cases, the ADC may be configured to go into a low power mode between each conversion (i.e., sampling time plus associated conversion processing).

For example, shown in FIG. 1 is an exemplary waveform 100. At times 102a, 102b, it is desired to begin sampling the signal 100. Sampling occurs over a conversion time denoted by reference numerals 104a, 104b. During the period 106 between the end of conversion period 104a and the start of conversion time 104b, it may be desired to put the ADC into a low power mode.

However, exiting the low power mode, i.e., powering up, requires a time period that must be accounted for to ensure the accuracy of the ADC.

SUMMARY

An analog-to-digital converter, in accordance with embodiments, includes circuitry for receiving an analog input and converting the input to a digital signal; and non-transitory control circuitry configured for: receiving a sampling time; receiving a conversion time; determining a power up time from at least one sleep mode; and causing the digital-to-analog converter to enter into the at least one sleep mode if the sum of the power up time and conversion time is less than the sampling time.

In some embodiments, the at least one sleep mode comprises a plurality of sleep modes and the determining a power up time comprises determining power up times associated with each of the plurality of sleep modes. In some embodiments, entering the digital-to-analog converter into the at least one sleep mode comprises entering the digital-to-analog converter into a lowest power of the plurality of sleep modes whose sum of power up time and conversion time is less than the sampling time. In some embodiments, determining a power up time comprises an estimated power up time. In some embodiments, the sampling time, the conversion time, and the power up time are converted to a number of clock periods.

In some embodiments, the control circuitry is configured for transitioning from a first low power state to a second low power state, the transitioning comprising comparing a power up time of the second low power state with an elapsed power up time count of the first low power state and resetting a count to the power up time of the second low power state if the power up time of the second low power state is greater than a time remaining for the first power up time. In some embodiments, the control circuitry is configured for continuing the count if the elapsed power up time count is greater than power up time of the second low power state.\

According to some embodiments, a non-transitory computer-readable medium containing instructions which when implemented by a computer perform a method for operating an analog-to-digital converter, including: receiving a sampling time; receiving a conversion time; determining a power up time from at least one sleep mode; and entering the analog-to-digital converter into the at least one sleep mode if the sum of the power up time and conversion time is less than the sampling time.

In some embodiments, the at least one sleep mode comprises a plurality of sleep modes and the determining a power up time comprises determining power up times associated with each of the plurality of sleep modes. In some embodiments, entering the analog-to-digital converter into the at least one sleep mode comprises entering the analog-to-digital converter into a lowest power of the plurality of sleep modes whose sum of power up time and conversion time is less than the sampling time. In some embodiments, determining a power up time comprises an estimated power up time. In some embodiments, the sampling time, the conversion time, and the power up time are converted to a number of clock periods.

In some embodiments, the method includes transitioning from a first low power state to a second low power state, the transitioning comprising comparing a power up time of the second low power state with an elapsed power up time count of the first low power state and resetting a count to the power up time of the second low power state if the power up time of the second low power state is greater than a time remaining for the first power up time. In some embodiments, the method includes continuing the count if the elapsed power up time count is greater than power up time of the second low power state.

A method for operating an analog-to-digital converter according to embodiments includes receiving a sampling time; receiving a conversion time; determining a power up time from at least one sleep mode; and entering the analog-to-digital converter into the at least one sleep mode if the sum of the power up time and conversion time is less than the sampling time.

In some embodiments, the at least one sleep mode comprises a plurality of sleep modes and the determining a power up time comprises determining power up times associated with each of the plurality of sleep modes. In some embodiments, entering the digital-to-analog converter into the at least one sleep mode comprises entering the digital-to-analog converter into a lowest power of the plurality of sleep modes whose sum of respective power up time and conversion time is less than the sampling time. In some embodiments, determining a power up time comprises an estimated power up time. In some embodiments, the sampling time, the conversion time, and the power up time are converted to a number of clock periods.

In some embodiments, the method includes transitioning from a first low power state to a second low power state, the transitioning comprising comparing a power up time of the second low power state with an elapsed power up time count of the first low power state and resetting a count to the power up time of the second low power state if the power up time of the second low power state is greater than a time remaining for the first power up time. In some embodiments, the method includes continuing the count if the elapsed power up time count is greater than power up time of the second low power state.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein:

FIG. 5 is a diagram illustrating an example of signaling and timer function.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Figure 1:
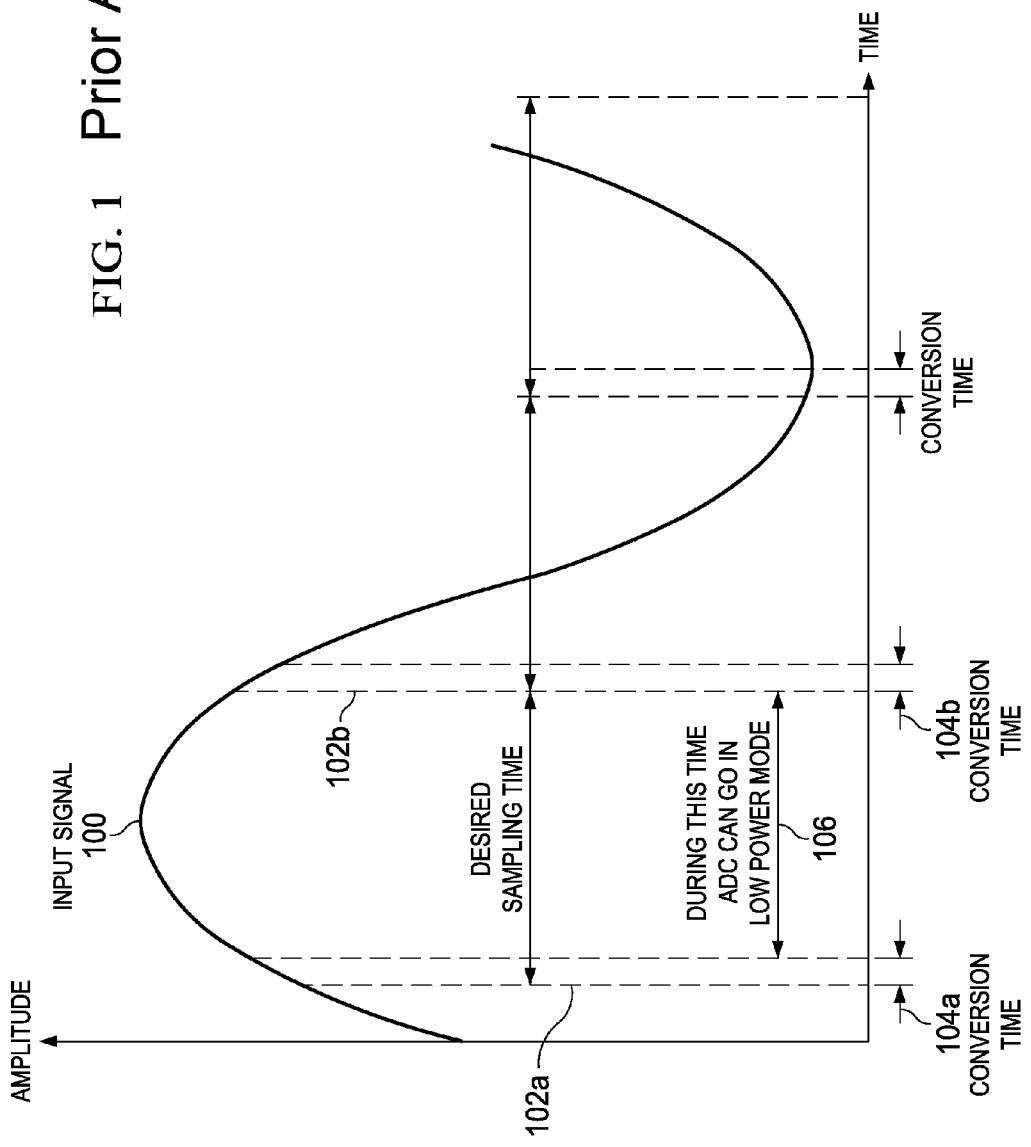
FIG. 1 is a diagram schematically illustrating ADC operation.
Figure 2:
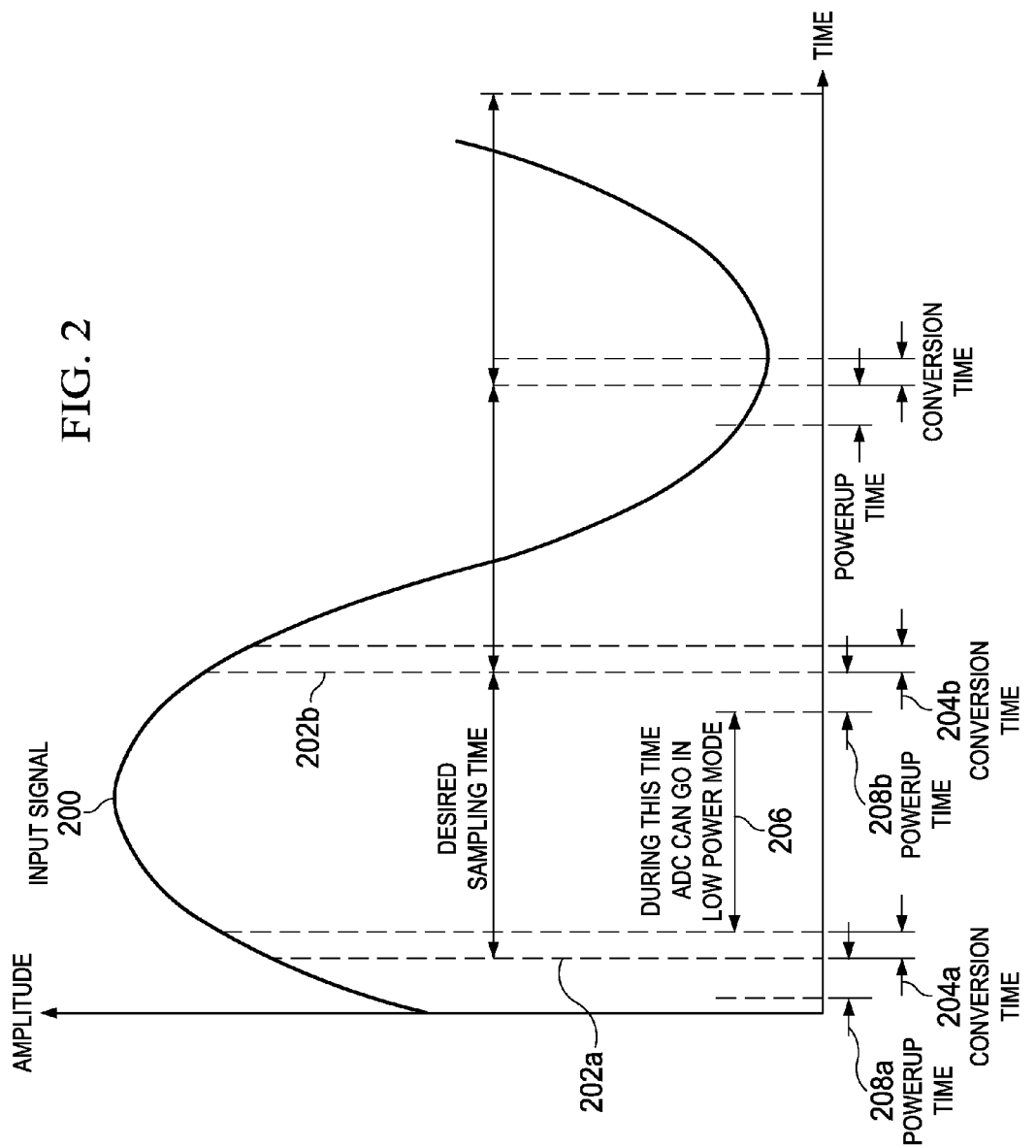
FIG. 2 is a diagram schematically illustrating ADC operation.

Embodiments provide an ADC that is configured with power up timing information and includes a timer for to account for such time when exiting a low power mode. For example, FIG. 2 illustrates an exemplary signal to be sampled 200. At times 202a, 202b, it is desired to begin sampling the signal 200. Sampling occurs over a conversion time denoted by reference numerals 204a, 204b. During the period 206 between the end of conversion period 204a and the start of conversion time 204b, it may be desired to put the ADC into a low power mode. Exiting the power down mode takes a duration 208a, 208b. Embodiments account for the power up duration 208a, 208b and cause the ADC to exit the power down mode that period prior to the next conversion time.

Figure 3:
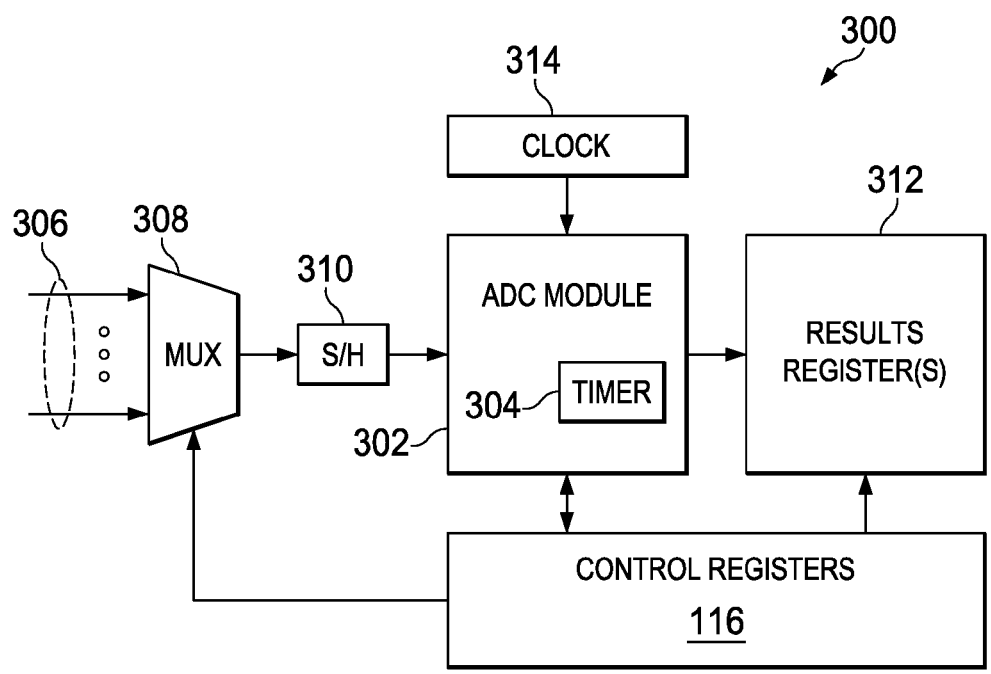
FIG. 3 is a diagram illustrating an exemplary analog-to-digital converter in accordance with embodiments.

Turning now to FIG. 3, a block diagram of an exemplary analog-to-digital converter that may implement embodiments is shown. The analog-to-digital converter 300 includes an analog-to-digital converter module 302 including or communicatively coupled to a timer 304. As will be explained in greater detail below, the timer counts down a time between conversions so that a power down mode can be exited while accommodating the power up time requirements.

The ADC 300 may receive analog inputs 306 at one or more input interfaces, such as multiplexers 308. The inputs may be provided to one or more sample and hold circuits 310 and then to ADC module 302, where conversion occurs. The results of the conversion are provided to one or more results registers 312. The ADC module is driven by a clock 314 such as a system clock. In some embodiments, the timer 304 counts clock cycles. One or more control registers 116 may be provided for controlling operation of the ADC 300. In some embodiments, as will be discussed in greater detail below, the control registers 116 may be used to select from one or more low power modes.

In general, the maximum power up time from a particular low power mode may be determined by the design of the ADC based on the process, temperature voltage variations and converted to a maximum number of clock periods with either the maximum defined sampling clock rate, a sampling clock estimate given by a user in a clock register, or directly estimated with clock measurement circuitry (not shown). The power up time can be evaluated during a design process and hardcoded into each part for each low power mode.

Once the power up times are known, they are converted into a number of clock periods (associated with a known clock frequency). Each lower power mode can then be associated with a certain number of clock periods in which the ADC is to reach full operating conversion mode when transitioning from the low power mode to the conversion mode. So long as the clock is constant, the low power mode power up time is a fixed number of clocks.

In operation, the timer 304 will receive a conversion signal (such as an interrupt or pulse) that indicates the start of a conversion. Between the end of that conversion and the start of the next conversion, in some embodiments, the timer 304 will then automatically choose the mode with the lowest possible power consumption that will guarantee that the associated power up time and conversion time are less than the sampling time. If they are not, then the ADC is not put in a low power mode in between conversions, but into a reset mode where is can begin conversion instantaneously upon elapse of the sampling time.

Figure 4:
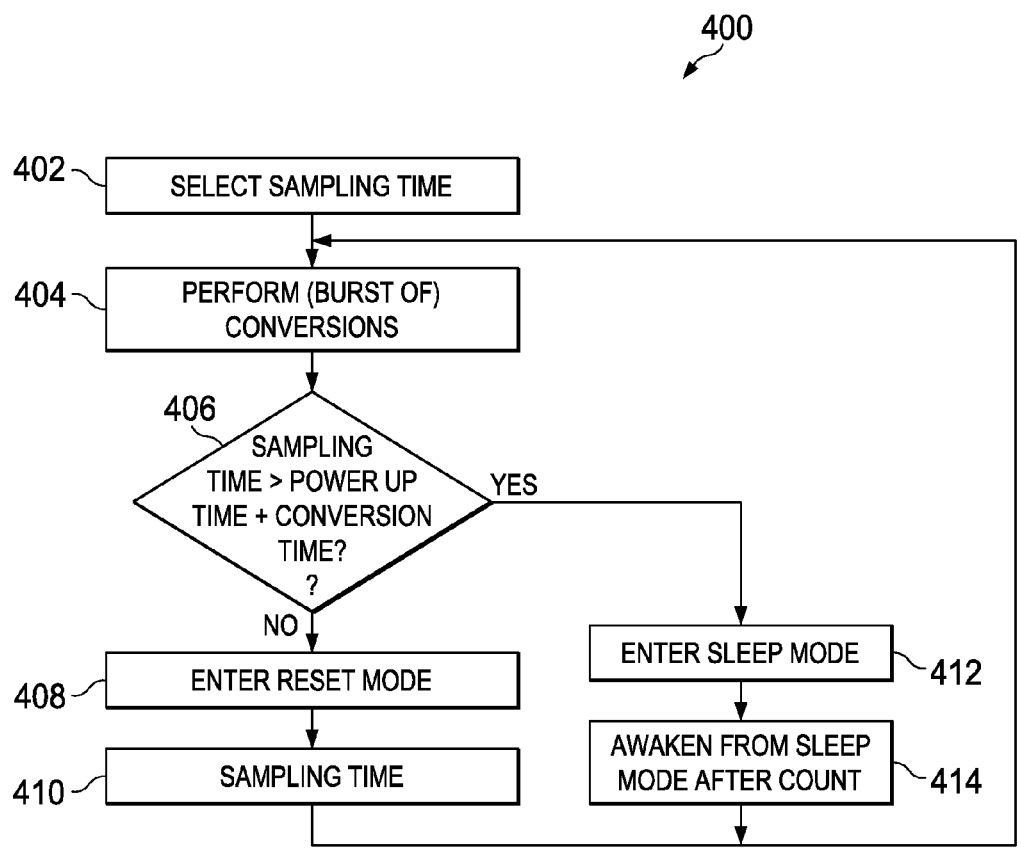
FIG. 4 is a flowchart illustrating operation of embodiments.

Turning now to FIG. 4, a flowchart 400 illustrating operation of an embodiment is shown. In the embodiment illustrated, the low power mode is termed a "sleep" mode. Initially, a user can select a sampling time period (step 402), for example, by programming one or more of the control registers (FIG. 3). At the selected time, the ADC will then perform a conversion or burst of conversions (step 404). In addition, the ADC will determine if the sampling time is greater than the conversion time and the power up time for one or more power ups from low power modes (step 406). If it is not, the ADC will enter a reset mode (step 408) (i.e., a mode in which power up time is virtually zero) and count until the next sampling time (410), whereupon it will perform the next conversion(s).

Otherwise, if the sampling time period is larger than the power up time of the low power mode plus the conversion time, the ADC will go in the low power mode (step 412) just after the conversion (or burst of conversions). It will start the power up sequence (step 414) after a time equal to sampling period time minus power up time. At the end of the power up sequence, it will loop to the step 404 and restart the conversion process.

In some embodiments, the method can also include a check of whether the sampling time period is less than the conversion time. If so, then an error flag can be sent to the appropriate control registers (the conversion time cannot be larger than the sampling time period).

As noted above, in some embodiments, multiple low power modes are possible and accounted for. For example, in such a case, the step 406 in FIG. 4 would include a detection of the condition (sampling time>powerup time+conversion time) for each associated powerup time with each low power mode. The ADC will then automatically choose the lowest possible power mode that satisfies a true condition to this check. The power consumption of each low power mode can be evaluated during a design process and the priority of the low power mode in the ADC choice during the step 406 may be determined upfront before the start of the conversion process.

In particular, FIG. 5 illustrates by way of example the handling of four ADC modes: Conversion, Sleep, Shutdown, and Standby, where the last three are low power modes. In operation, transitions to each mode are immediate but conversions start only when the counter ADC_SETUP TIMER reaches zero. The timer may correspond to the timer 304 of FIG. 3. It is noted that, while FIG. 5 depicts a timing diagram in which ADC_SETUP TIMER is decreasing, in other embodiments, the timer may be configured to increase to one or more threshold levels.

A transition to a higher power state resets the timer to the corresponding power up time only if the current value is lower than the power up time. That is, when changing to a lower power mode, the timer 304 is set to the larger value. When the clock is running and when a conversion needs to be started, the timer 304 counts backward from the current value to zero. If zero is reached, the conversion can be launched. If another low power mode than the current one is desired, the ADC will go directly into the lower power mode and the timer 304 will take the new power up time if the current value is less than the associated power up time of the new low power state. If it is greater, it will continue to decrease synchronously with the clock until it reaches the associated power up time of the new low power state. Thus, the system guarantees that the right power up time is elapsed no matter the transitions required between the low power modes. That is, the system guarantees the ADC is in a state where it is ready to convert and therefore guarantees conversion accuracy for each conversion no matter what transitions between low power modes have taken place before the beginning of the conversion.

Shown in FIG. 5 are a DM_CLK clock entry and an ADC_MODE control register entry. In addition, a DRn pin may be asserted if needed to indicate the start of conversions. In the example illustrated, power up times increase as power consumption of the corresponding mode decreases. Exemplary Standby power up time is 0 clock cycles; sleep power up time is 256 clock cycles, and shutdown power up time is 2048 clock cycles. The conversion mode is identified by 11, the sleep mode by 01, the standby mode by 10 and the shutdown mode by 00.

When in shutdown mode, the timer ADC_SETUP is reset to 2048 DM_CLK clock cycles. This means that the powerup time of this mode is 2048 clock cycles. Since this is the lowest power mode, and the longest powerup time, once the mode is changed to shutdown mode, the timer goes back to 2048 without any condition.

When the ADC is configured to SLEEP mode, the associated power up time is 256 DM_CLK clock periods. If the timer value was inferior to 256 before entering in the sleep mode, the timer value is immediately reset to 256 at the transition to sleep mode. It needs 256 clock periods to power up from this mode. However when the timer value is superior than 256 before the transition, the timer decrements down to 256 synchronously with the DM_CLK clock, so that the transition from a previous low power mode (with a longer power up time) is guaranteed to happen and to respect the powerup time of the previous low power mode.

When in standby mode, the timer decreases synchronously with DM_CLK clock down to eventually 0 (since the power up time of the standby ode is 0) where the conversion mode can take place instantaneously if required by the ADC.

FIG. 5 thus depicts a series of transitions on the ADC_MODE settings generated by the ADC (or the user through control registers) and describes the state of the internal ADC_SETUP timer (expressed in number of DM_CLK periods it takes to enable a possible conversion sequence start). Once it reaches 0, the ADC conversion can take place if the conversion process is initiated by the ADC or the user (ADC_MODE=11). If ADC_MODE=11 and the timer is not equal to 0, the conversion start is delayed until the timer reaches 0. Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Any suitable programming language can be used to implement the routines, methods or programs of embodiments of the invention described herein, including C, C++, Java, assembly language, etc. Different programming techniques can be employed such as procedural or object oriented. Any particular routine can execute on a single computer processing device or multiple computer processing devices, a single computer processor or multiple computer processors. Data may be stored in a single storage medium or distributed through multiple storage mediums, and may reside in a single database or multiple databases (or other data storage techniques). Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. The routines can operate in an operating system environment or as stand-alone routines. Functions, routines, methods, steps and operations described herein can be performed in hardware, software, firmware or any combination thereof.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A method for operating an analog-to-digital converter, comprising:
   receiving a sampling time;
   receiving a conversion time;
   determining a power up time from at least one sleep mode; and
   entering the analog-to-digital converter into the at least one sleep mode if the sum of the power up time and conversion time is less than the sampling time.

2. The method according to claim 1, wherein the at least one sleep mode comprises a plurality of sleep modes and the determining a power up time comprises determining power up times associated with each of the plurality of sleep modes.

3. The method according to claim 2, wherein the entering the analog-to-digital converter into the at least one sleep mode comprises entering the analog-to-digital converter into a lowest power of the plurality of sleep modes whose sum of respective power up time and conversion time is less than the sampling time.

4. The method according to claim 3, wherein determining a power up time comprises an estimated power up time.

5. The method according to claim 1, wherein the sampling time, the conversion time, and the power up time are converted to a number of clock periods.

6. The method according to claim 3, further comprising transitioning from a first low power state to a second low power state, the transitioning comprising comparing a power up time of the second low power state with an elapsed power up time count of the first low power state and resetting a count to the power up time of the second low power state if the power up time of the second low power state is greater than a time remaining for the first power up time.

7. The method according to claim 6, further comprising continuing the count if the elapsed power up time count is greater than power up time of the second low power state.

8. A non-transitory computer-readable medium containing instructions which when implemented by a computer perform a method for operating an analog-to-digital converter, comprising:
   receiving a sampling time;
   receiving a conversion time;
   determining a power up time from at least one sleep mode; and
   entering the analog-to-digital converter into the at least one sleep mode if the sum of the power up time and conversion time is less than the sampling time.

9. The non-transitory computer-readable medium according to claim 8, wherein the at least one sleep mode comprises a plurality of sleep modes and the determining a power up time comprises determining power up times associated with each of the plurality of sleep modes.

10. The non-transitory computer-readable medium according to claim 9, wherein the entering the analog-to-digital converter into the at least one sleep mode comprises entering the analog-to-digital converter into a lowest power of the plurality of sleep modes whose sum of power up time and conversion time is less than the sampling time.

11. The non-transitory computer-readable medium according to claim 10, wherein determining a power up time comprises an estimated power up time.

12. The non-transitory computer-readable medium according to claim 9, wherein the sampling time, the conversion time, and the power up time are converted to a number of clock periods.

13. The non-transitory computer-readable medium according to claim 12, further comprising transitioning from a first low power state to a second low power state, the transitioning comprising comparing a power up time of the second low power state with an elapsed power up time count of the first low power state and resetting a count to the power up time of the second low power state if the power up time of the second low power state is greater than a time remaining for the first power up time.

14. The non-transitory computer-readable medium according to claim 13, further comprising continuing the count if the elapsed power up time count is greater than power up time of the second low power state.

15. An analog-to-digital converter, comprising:
circuitry for receiving an analog input and converting the input to a digital signal; and
non-transitory control circuitry configured for:
receiving a sampling time;
receiving a conversion time;
determining a power up time from at least one sleep mode; and
causing the analog-to-digital converter to enter into the at least one sleep mode if the sum of the power up time and conversion time is less than the sampling time.

16. The analog-to-digital converter according to claim 15, wherein the at least one sleep mode comprises a plurality of sleep modes and the determining a power up time comprises determining power up times associated with each of the plurality of sleep modes.

17. The analog-to-digital converter according to claim 16, wherein the entering the analog-to-digital converter into the at least one sleep mode comprises entering the analog-to-digital converter into a lowest power of the plurality of sleep modes whose sum of power up time and conversion time is less than the sampling time.

18. The analog-to-digital converter according to claim 17, wherein determining a power up time comprises an estimated power up time.

19. The analog-to-digital converter according to claim 15, wherein the sampling time, the conversion time, and the power up time are converted to a number of clock periods.

20. The analog-to-digital converter according to claim 17, further comprising transitioning from a first low power state to a second low power state, the transitioning comprising comparing a power up time of the second low power state with an elapsed power up time count of the first low power state and resetting a count to the power up time of the second low power state if the power up time of the second low power state is greater than a time remaining for the first power up time.

21. The analog-to-digital converter according to claim 20, further comprising continuing the count if the elapsed power up time count is greater than power up time of the second low power state.

* * * * *